United States Patent
Bosch et al.

(10) Patent No.: US 9,007,190 B2
(45) Date of Patent: Apr. 14, 2015

(54) STEERING WHEEL SENSORS

(75) Inventors: Jerome Bosch, Romeo, MI (US); David Andrews, Ortonville, MI (US); Jason Lisseman, Shelby Township, MI (US)

(73) Assignee: TK Holdings Inc., Auburn Hills, MI (US)

( * ) Notice: Subject to any disclaimer, the term of this patent is extended or adjusted under 35 U.S.C. 154(b) by 678 days.

(21) Appl. No.: 13/076,226

(22) Filed: Mar. 30, 2011

(65) Prior Publication Data
US 2011/0241850 A1 Oct. 6, 2011

Related U.S. Application Data

(60) Provisional application No. 61/319,637, filed on Mar. 31, 2010.

(51) Int. Cl.
| | |
|---|---|
| *G08B 3/10* | (2006.01) |
| *H03K 17/96* | (2006.01) |
| *B60K 37/06* | (2006.01) |
| *B60Q 1/00* | (2006.01) |
| *G06F 3/01* | (2006.01) |
| *G06F 3/044* | (2006.01) |
| *G06F 3/045* | (2006.01) |

(Continued)

(52) U.S. Cl.
CPC ....... *H03K 17/9625* (2013.01); *Y10T 74/20834* (2015.01); *B60K 37/06* (2013.01); *B60K 2350/928* (2013.01); *B60Q 1/0082* (2013.01); *G06F 3/016* (2013.01); *G06F 3/044* (2013.01); *G06F 3/045* (2013.01); *H01H 2003/008* (2013.01); *H01H 2239/006* (2013.01); *H01H 2239/078* (2013.01); *H03K 17/975* (2013.01); *H03K 2217/96062* (2013.01)

(58) Field of Classification Search
USPC .............. 340/384, 576, 384.6, 392.3; 74/552; 73/117.02, 893, 862.627, 293; 116/202; 345/173, 174; 180/333
See application file for complete search history.

(56) References Cited

U.S. PATENT DOCUMENTS

| | | | |
|---|---|---|---|
| 3,585,626 | A | 6/1971 | Tartarini |
| 4,268,815 | A | 5/1981 | Eventoff et al. |
| 4,276,538 | A | 6/1981 | Eventoff et al. |

(Continued)

FOREIGN PATENT DOCUMENTS

| | | | |
|---|---|---|---|
| DE | 60011078 T2 | 6/2005 | |
| DE | 60210951 T2 | 1/2007 | |

(Continued)

OTHER PUBLICATIONS

Copending U.S. Appl. No. 13/074,739, filed Mar. 29, 2011.

(Continued)

*Primary Examiner* — Hoi Lau
(74) *Attorney, Agent, or Firm* — Meunier Carlin & Curfman, LLC

(57) ABSTRACT

A sensor for installation on a steering wheel includes a pressure sensitive material mounted on a base material of the steering wheel. The pressure sensitive material is configured to provide an electrical signal to a controller when pressure is applied. The controller provides a command to a vehicle system based on the electrical signal. The pressure sensitive material has at least one of a variable resistance and a variable capacitance based on the amount or type of pressure that is applied to the material. The electrical signal is based on the at least one of a variable resistance and a variable capacitance.

21 Claims, 7 Drawing Sheets

(51) Int. Cl.
*H03K 17/975* (2006.01)
*H01H 3/00* (2006.01)

(56) References Cited

U.S. PATENT DOCUMENTS

| | | | |
|---|---|---|---|
| 4,301,337 A | 11/1981 | Eventoff | |
| 4,314,227 A | 2/1982 | Eventoff | |
| 4,314,228 A | 2/1982 | Eventoff | |
| 4,315,238 A | 2/1982 | Eventoff | |
| 4,451,714 A | 5/1984 | Eventoff | |
| 4,484,026 A * | 11/1984 | Thornburg | 178/18.05 |
| 4,489,302 A | 12/1984 | Eventoff | |
| 4,540,979 A * | 9/1985 | Gerger et al. | 340/576 |
| 4,739,299 A | 4/1988 | Eventoff et al. | |
| 4,801,771 A * | 1/1989 | Mizuguchi et al. | 200/86 R |
| 4,810,992 A | 3/1989 | Eventoff | |
| 4,929,934 A * | 5/1990 | Ueda et al. | 345/174 |
| 4,963,702 A | 10/1990 | Yaniger et al. | |
| 5,053,585 A | 10/1991 | Yaniger | |
| 5,159,159 A | 10/1992 | Asher | |
| 5,186,055 A | 2/1993 | Kovacich et al. | |
| 5,209,967 A | 5/1993 | Wright et al. | |
| 5,262,778 A | 11/1993 | Saunders | |
| 5,296,837 A | 3/1994 | Yaniger | |
| 5,302,936 A | 4/1994 | Yaniger | |
| 5,365,671 A | 11/1994 | Yaniger | |
| 5,398,962 A * | 3/1995 | Kropp | 280/731 |
| 5,423,569 A * | 6/1995 | Reighard et al. | 280/731 |
| 5,453,941 A * | 9/1995 | Yoshikawa | 178/18.05 |
| 5,463,258 A * | 10/1995 | Filion et al. | 307/10.1 |
| 5,510,783 A | 4/1996 | Findlater et al. | |
| 5,539,259 A * | 7/1996 | Filion et al. | 307/10.1 |
| 5,659,334 A | 8/1997 | Yaniger et al. | |
| 5,670,988 A | 9/1997 | Tickle | |
| 5,793,297 A * | 8/1998 | Takeuchi et al. | 340/635 |
| 5,828,363 A | 10/1998 | Yaniger et al. | |
| 5,847,639 A | 12/1998 | Yaniger | |
| 5,854,625 A | 12/1998 | Frisch et al. | |
| 5,871,063 A * | 2/1999 | Young | 180/268 |
| 5,907,419 A | 5/1999 | Martnelli et al. | |
| 5,914,658 A * | 6/1999 | Arakawa | 340/568.8 |
| 5,943,044 A | 8/1999 | Martinelli et al. | |
| 5,965,952 A * | 10/1999 | Podoloff et al. | 307/10.1 |
| 5,982,519 A | 11/1999 | Martnelli et al. | |
| 6,016,103 A | 1/2000 | Leavitt | |
| 6,084,572 A | 7/2000 | Yaniger | |
| 6,172,610 B1 | 1/2001 | Prus | |
| 6,239,790 B1 | 5/2001 | Martinelli et al. | |
| 6,291,568 B1 | 9/2001 | Lussey | |
| 6,333,736 B1 * | 12/2001 | Sandbach | 345/178 |
| 6,378,384 B1 * | 4/2002 | Atkinson et al. | 73/862.625 |
| 6,388,556 B1 | 5/2002 | Imai et al. | |
| 6,396,523 B1 | 5/2002 | Segal et al. | |
| 6,429,846 B2 | 8/2002 | Rosenberg et al. | |
| 6,437,682 B1 | 8/2002 | Vance | |
| 6,495,069 B1 | 12/2002 | Lussey et al. | |
| 6,501,463 B1 * | 12/2002 | Dahley et al. | 345/173 |
| 6,529,122 B1 | 3/2003 | Magnussen et al. | |
| 6,531,951 B2 | 3/2003 | Serban et al. | |
| 6,538,643 B2 | 3/2003 | Mori et al. | |
| 6,563,415 B2 | 5/2003 | Armstrong | |
| 6,590,499 B1 | 7/2003 | D'Agosto | |
| 6,646,540 B1 | 11/2003 | Lussey | |
| 6,661,345 B1 | 12/2003 | Bevan et al. | |
| 6,690,365 B2 | 2/2004 | Hinckley et al. | |
| 6,750,803 B2 | 6/2004 | Yates et al. | |
| 6,758,689 B1 | 7/2004 | Bair et al. | |
| 6,765,557 B1 | 7/2004 | Segal et al. | |
| 6,791,532 B2 | 9/2004 | Hirano et al. | |
| 6,801,191 B2 | 10/2004 | Mukai et al. | |
| 6,809,280 B2 | 10/2004 | Divigalpitiya et al. | |
| 6,820,804 B2 | 11/2004 | Segal et al. | |
| 6,822,640 B2 | 11/2004 | Derocher | |
| 6,850,221 B1 | 2/2005 | Tickle | |
| 6,861,961 B2 | 3/2005 | Sandbach et al. | |
| 6,875,938 B2 | 4/2005 | Schmiz et al. | |
| 6,888,537 B2 | 5/2005 | Benson et al. | |
| 6,906,700 B1 * | 6/2005 | Armstrong | 345/161 |
| 6,909,354 B2 | 6/2005 | Baker et al. | |
| 6,947,031 B2 | 9/2005 | Sandbach et al. | |
| 6,995,752 B2 | 2/2006 | Lu | |
| 7,050,045 B2 | 5/2006 | Baker et al. | |
| 7,084,859 B1 | 8/2006 | Pryor | |
| 7,091,436 B2 | 8/2006 | Serban | |
| 7,091,998 B2 | 8/2006 | Miller-Smith | |
| 7,112,755 B2 | 9/2006 | Kitano et al. | |
| 7,113,179 B2 | 9/2006 | Baker et al. | |
| 7,126,583 B1 * | 10/2006 | Breed | 345/158 |
| 7,154,484 B2 | 12/2006 | Komata | |
| 7,158,122 B2 | 1/2007 | Roberts | |
| 7,161,460 B2 | 1/2007 | Federspiel | |
| 7,170,428 B2 | 1/2007 | Himberg et al. | |
| 7,176,889 B2 | 2/2007 | Baker et al. | |
| 7,190,348 B2 | 3/2007 | Kennedy et al. | |
| 7,213,323 B2 | 5/2007 | Baker et al. | |
| 7,215,330 B2 | 5/2007 | Rantet | |
| 7,250,940 B2 | 7/2007 | Jayanetti et al. | |
| 7,295,904 B2 | 11/2007 | Kanevsky et al. | |
| 7,301,435 B2 | 11/2007 | Lussey et al. | |
| 7,310,089 B2 | 12/2007 | Baker et al. | |
| 7,324,095 B2 | 1/2008 | Sharma | |
| 7,336,260 B2 | 2/2008 | Martin et al. | |
| 7,345,675 B1 | 3/2008 | Minakuchi | |
| 7,356,769 B2 | 4/2008 | Lehtonen | |
| 7,377,133 B2 | 5/2008 | Sandbach et al. | |
| 7,388,571 B2 | 6/2008 | Lowles et al. | |
| 7,432,459 B2 | 10/2008 | Stoschek et al. | |
| 7,468,199 B2 | 12/2008 | Divigalpitiya et al. | |
| 7,511,702 B2 | 3/2009 | Hotelling | |
| 7,554,045 B2 | 6/2009 | Sandbach et al. | |
| 7,554,051 B2 | 6/2009 | Crispin | |
| 7,554,531 B2 | 6/2009 | Baker et al. | |
| 7,573,464 B2 | 8/2009 | Baker et al. | |
| 7,576,294 B2 | 8/2009 | Clemens et al. | |
| 7,603,917 B2 | 10/2009 | Graham et al. | |
| 7,614,008 B2 | 11/2009 | Ording | |
| 7,619,616 B2 | 11/2009 | Rimas-Ribikauskas et al. | |
| 7,629,966 B2 | 12/2009 | Anson | |
| 7,649,278 B2 * | 1/2010 | Yoshida et al. | 307/9.1 |
| 7,683,889 B2 | 3/2010 | Rimas-Ribikauskas et al. | |
| 7,683,890 B2 | 3/2010 | Geaghan | |
| 7,688,213 B2 | 3/2010 | Power | |
| 7,693,631 B2 | 4/2010 | Yukawa et al. | |
| 7,721,609 B2 | 5/2010 | Wright | |
| 7,724,242 B2 | 5/2010 | Hillis et al. | |
| 7,733,209 B2 | 6/2010 | Kurtz | |
| 7,746,327 B2 | 6/2010 | Miyakoshi | |
| 7,772,960 B2 | 8/2010 | Baker | |
| 7,773,075 B2 | 8/2010 | Otsuka et al. | |
| 7,777,730 B2 | 8/2010 | Geurts et al. | |
| 7,791,596 B2 | 9/2010 | Errico et al. | |
| 7,808,488 B2 | 10/2010 | Martin et al. | |
| 7,813,774 B2 | 10/2010 | Perez-Noguera | |
| 7,822,443 B2 | 10/2010 | Kim et al. | |
| 7,830,265 B2 | 11/2010 | Power | |
| 7,863,822 B2 | 1/2011 | Stoschek et al. | |
| 7,898,381 B2 | 3/2011 | Hatsuda | |
| 7,903,090 B2 | 3/2011 | Soss et al. | |
| 7,952,566 B2 | 5/2011 | Poupyrev et al. | |
| 7,973,773 B2 | 7/2011 | Pryor | |
| 8,022,933 B2 | 9/2011 | Hardacker et al. | |
| 8,026,902 B2 | 9/2011 | Medler et al. | |
| 8,026,906 B2 | 9/2011 | Mölne | |
| 8,035,535 B2 | 10/2011 | Nousiainen | |
| 8,037,770 B2 | 10/2011 | Larson et al. | |
| 8,049,730 B2 | 11/2011 | Joguet et al. | |
| 8,049,731 B2 | 11/2011 | Baker et al. | |
| 8,049,737 B2 | 11/2011 | Cho et al. | |
| 8,059,104 B2 | 11/2011 | Shahoian et al. | |
| 8,063,322 B2 | 11/2011 | Katsurahira | |
| 8,063,886 B2 | 11/2011 | Serban et al. | |
| 8,072,439 B2 | 12/2011 | Hillis et al. | |
| 8,072,440 B2 | 12/2011 | Pryor | |
| 8,081,165 B2 | 12/2011 | Reiner | |

(56) References Cited

U.S. PATENT DOCUMENTS

| | | |
|---|---|---|
| 8,091,437 B2 | 1/2012 | Stumpf |
| 8,094,130 B2 | 1/2012 | Griffin et al. |
| 8,095,278 B2 | 1/2012 | Schaaf et al. |
| 8,098,236 B2 | 1/2012 | Klein et al. |
| 8,113,065 B2 | 2/2012 | Ohsato et al. |
| 8,120,586 B2 | 2/2012 | Hsu et al. |
| 8,120,588 B2 | 2/2012 | Klinghult |
| 8,130,207 B2 | 3/2012 | Nurmi et al. |
| 8,134,535 B2 | 3/2012 | Choi et al. |
| 8,139,038 B2 | 3/2012 | Chueh et al. |
| 8,144,133 B2 | 3/2012 | Wang et al. |
| 8,149,211 B2 | 4/2012 | Hayakawa et al. |
| 8,151,210 B2 | 4/2012 | Nezu et al. |
| 8,154,528 B2 | 4/2012 | Chen et al. |
| 8,159,473 B2 | 4/2012 | Cheng et al. |
| 8,169,295 B2 | 5/2012 | Walkington |
| 8,171,431 B2 | 5/2012 | Grossman et al. |
| 8,184,093 B2 | 5/2012 | Tsuiki |
| 8,184,106 B2 | 5/2012 | Serban |
| 8,188,985 B2 | 5/2012 | Hillis et al. |
| 8,199,116 B2 | 6/2012 | Jeon et al. |
| 8,203,454 B2 * | 6/2012 | Knight et al. .............. 340/573.1 |
| 8,212,790 B2 | 7/2012 | Rimas-Ribikauskas et al. |
| 8,214,105 B2 * | 7/2012 | Daly et al. ...................... 701/36 |
| 8,228,305 B2 | 7/2012 | Pryor |
| 8,229,603 B2 | 7/2012 | Miyata et al. |
| 8,237,537 B2 | 8/2012 | Kurtz |
| 8,239,784 B2 | 8/2012 | Hotelling et al. |
| 8,243,035 B2 | 8/2012 | Abe et al. |
| 8,243,039 B2 | 8/2012 | Trachte |
| 8,253,699 B2 | 8/2012 | Son |
| 8,269,731 B2 * | 9/2012 | Molne .......................... 345/173 |
| 2001/0040551 A1 | 11/2001 | Yates et al. |
| 2002/0054060 A1 * | 5/2002 | Schena ........................ 345/701 |
| 2002/0097229 A1 | 7/2002 | Rose et al. |
| 2002/0135457 A1 | 9/2002 | Sandbach et al. |
| 2002/0196131 A1 | 12/2002 | McCarthy et al. |
| 2003/0011576 A1 | 1/2003 | Sandbach et al. |
| 2003/0043014 A1 * | 3/2003 | Nakazawa et al. ............. 338/47 |
| 2003/0074092 A1 | 4/2003 | Carrabis |
| 2003/0076968 A1 * | 4/2003 | Rast ............................. 381/124 |
| 2003/0083131 A1 * | 5/2003 | Armstrong ..................... 463/37 |
| 2003/0160808 A1 | 8/2003 | Foote et al. |
| 2004/0071471 A1 | 4/2004 | Baker et al. |
| 2004/0212189 A1 | 10/2004 | Kachu |
| 2004/0217331 A1 | 11/2004 | Lussey et al. |
| 2004/0252007 A1 | 12/2004 | Lussey et al. |
| 2005/0052426 A1 * | 3/2005 | Hagermoser et al. ......... 345/173 |
| 2005/0052427 A1 | 3/2005 | Wu et al. |
| 2005/0055145 A1 | 3/2005 | Bober et al. |
| 2005/0067889 A1 * | 3/2005 | Chernoff et al. ............... 303/20 |
| 2005/0273218 A1 * | 12/2005 | Breed et al. .................... 701/2 |
| 2006/0025897 A1 * | 2/2006 | Shostak et al. .................. 701/1 |
| 2006/0028454 A1 | 2/2006 | Branton et al. |
| 2006/0054479 A1 * | 3/2006 | Iisaka et al. ................. 200/61.57 |
| 2006/0113880 A1 * | 6/2006 | Pei et al. ...................... 310/800 |
| 2006/0177212 A1 * | 8/2006 | Lamborghini et al. ....... 396/287 |
| 2006/0202954 A1 | 9/2006 | Ho |
| 2006/0248478 A1 * | 11/2006 | Liau ............................. 715/863 |
| 2006/0255903 A1 | 11/2006 | Lussey et al. |
| 2007/0056493 A1 | 3/2007 | Burkitt et al. |
| 2007/0062753 A1 * | 3/2007 | Yoshida et al. ............... 180/333 |
| 2007/0100523 A1 * | 5/2007 | Trachte ......................... 701/41 |
| 2007/0132736 A1 | 6/2007 | Crispin |
| 2007/0141939 A1 | 6/2007 | Sandbach et al. |
| 2007/0146313 A1 | 6/2007 | Newman et al. |
| 2007/0146342 A1 | 6/2007 | Medler et al. |
| 2007/0152959 A1 | 7/2007 | Peters |
| 2007/0176902 A1 | 8/2007 | Newman et al. |
| 2007/0229478 A1 | 10/2007 | Rosenberg et al. |
| 2007/0289859 A1 | 12/2007 | Sandbach et al. |
| 2008/0024438 A1 | 1/2008 | Collins et al. |
| 2008/0024454 A1 | 1/2008 | Everest |
| 2008/0030479 A1 | 2/2008 | Lowles et al. |
| 2008/0030482 A1 | 2/2008 | Elwell et al. |
| 2008/0036743 A1 | 2/2008 | Westerman et al. |
| 2008/0042856 A1 | 2/2008 | Power |
| 2008/0060854 A1 | 3/2008 | Perlin |
| 2008/0079604 A1 * | 4/2008 | Madonna et al. ......... 340/825.72 |
| 2008/0088577 A1 | 4/2008 | Lenneman et al. |
| 2008/0088600 A1 | 4/2008 | Prest et al. |
| 2008/0094367 A1 | 4/2008 | Van De Ven et al. |
| 2008/0170043 A1 | 7/2008 | Soss et al. |
| 2008/0202912 A1 * | 8/2008 | Boddie et al. .................. 200/600 |
| 2008/0211766 A1 | 9/2008 | Westerman et al. |
| 2008/0264183 A1 | 10/2008 | Graham et al. |
| 2008/0271933 A1 | 11/2008 | Morimoto |
| 2008/0278455 A1 | 11/2008 | Atkins et al. |
| 2008/0284743 A1 | 11/2008 | Hsu et al. |
| 2008/0289886 A1 | 11/2008 | Burkitt |
| 2008/0296073 A1 | 12/2008 | McDermid |
| 2008/0296140 A1 | 12/2008 | Yoshihara et al. |
| 2008/0302014 A1 | 12/2008 | Szczerba et al. |
| 2008/0303799 A1 | 12/2008 | Schwesig et al. |
| 2008/0303802 A1 | 12/2008 | Destura et al. |
| 2008/0309624 A1 | 12/2008 | Hotelling |
| 2008/0309626 A1 | 12/2008 | Westerman et al. |
| 2008/0316181 A1 | 12/2008 | Nurmi |
| 2009/0002325 A1 | 1/2009 | Jha et al. |
| 2009/0009482 A1 | 1/2009 | McDermid |
| 2009/0020343 A1 | 1/2009 | Rothkopf et al. |
| 2009/0027353 A1 | 1/2009 | Im et al. |
| 2009/0061823 A1 | 3/2009 | Chu |
| 2009/0095541 A1 | 4/2009 | Lee |
| 2009/0128507 A1 | 5/2009 | Hoshino et al. |
| 2009/0132128 A1 | 5/2009 | Marriott et al. |
| 2009/0140985 A1 | 6/2009 | Liu |
| 2009/0140989 A1 | 6/2009 | Ahlgren |
| 2009/0140994 A1 * | 6/2009 | Tanaka et al. ................. 345/173 |
| 2009/0151447 A1 * | 6/2009 | Jin et al. ......................... 73/293 |
| 2009/0153522 A1 | 6/2009 | Chou |
| 2009/0160529 A1 * | 6/2009 | Lamborghini et al. ....... 327/517 |
| 2009/0160793 A1 | 6/2009 | Rekimoto |
| 2009/0167722 A1 | 7/2009 | Villain |
| 2009/0184921 A1 | 7/2009 | Scott et al. |
| 2009/0201261 A1 | 8/2009 | Day |
| 2009/0237374 A1 | 9/2009 | Li et al. |
| 2009/0241378 A1 * | 10/2009 | Ellis, III ......................... 36/114 |
| 2009/0244017 A1 | 10/2009 | Pala et al. |
| 2009/0249191 A1 | 10/2009 | Leoutsarakos et al. |
| 2009/0256807 A1 | 10/2009 | Nurmi |
| 2009/0256817 A1 | 10/2009 | Perlin et al. |
| 2009/0258677 A1 | 10/2009 | Ellis et al. |
| 2009/0267921 A1 | 10/2009 | Pryor |
| 2009/0273573 A1 | 11/2009 | Hotelling |
| 2009/0279811 A1 | 11/2009 | Kilburn et al. |
| 2009/0309616 A1 | 12/2009 | Klinghult et al. |
| 2009/0322695 A1 | 12/2009 | Cho et al. |
| 2009/0327977 A1 | 12/2009 | Bachfischer et al. |
| 2010/0013774 A1 | 1/2010 | Chen et al. |
| 2010/0020030 A1 | 1/2010 | Kim et al. |
| 2010/0024573 A1 | 2/2010 | Daverman et al. |
| 2010/0026640 A1 | 2/2010 | Kim et al. |
| 2010/0039393 A1 | 2/2010 | Pratt et al. |
| 2010/0045454 A1 * | 2/2010 | Knight et al. ................. 340/521 |
| 2010/0045612 A1 * | 2/2010 | Molne ........................... 345/173 |
| 2010/0045624 A1 | 2/2010 | Hisatsugu et al. |
| 2010/0053078 A1 | 3/2010 | Kim et al. |
| 2010/0053116 A1 | 3/2010 | Daverman et al. |
| 2010/0062148 A1 | 3/2010 | Lussey et al. |
| 2010/0066697 A1 | 3/2010 | Jacomet et al. |
| 2010/0079391 A1 | 4/2010 | Joung |
| 2010/0079395 A1 | 4/2010 | Kim et al. |
| 2010/0085169 A1 | 4/2010 | Poupyrev et al. |
| 2010/0090973 A1 | 4/2010 | Algreatly |
| 2010/0097335 A1 | 4/2010 | Jung et al. |
| 2010/0097336 A1 | 4/2010 | Gomes et al. |
| 2010/0099394 A1 | 4/2010 | Hainzl |
| 2010/0102922 A1 | 4/2010 | Walkington |
| 2010/0102972 A1 | 4/2010 | Middlekauff et al. |
| 2010/0110018 A1 | 5/2010 | Faubert et al. |
| 2010/0110026 A1 | 5/2010 | Kis et al. |
| 2010/0117978 A1 | 5/2010 | Shirado |
| 2010/0123667 A1 | 5/2010 | Kim et al. |

(56) References Cited

U.S. PATENT DOCUMENTS

| | | | |
|---|---|---|---|
| 2010/0123678 A1 | 5/2010 | Kim et al. | |
| 2010/0123686 A1 | 5/2010 | Klinghult et al. | |
| 2010/0126840 A1 | 5/2010 | Walkington | |
| 2010/0127975 A1 | 5/2010 | Jensen | |
| 2010/0130808 A1 | 5/2010 | Hattori | |
| 2010/0141410 A1 | 6/2010 | Aono et al. | |
| 2010/0153879 A1 | 6/2010 | Rimas-Ribikauskas et al. | |
| 2010/0156818 A1 | 6/2010 | Burrough et al. | |
| 2010/0168998 A1* | 7/2010 | Matsunaga | 701/200 |
| 2010/0171713 A1 | 7/2010 | Kwok et al. | |
| 2010/0214239 A1 | 8/2010 | Wu | |
| 2010/0222972 A1 | 9/2010 | Hustyi | |
| 2010/0231540 A1 | 9/2010 | Cruz-Hernandez et al. | |
| 2010/0250071 A1 | 9/2010 | Pala et al. | |
| 2010/0253645 A1 | 10/2010 | Bolender | |
| 2010/0265170 A1 | 10/2010 | Norieda | |
| 2010/0271325 A1 | 10/2010 | Conte et al. | |
| 2010/0277438 A1 | 11/2010 | Kawashima et al. | |
| 2010/0283749 A1 | 11/2010 | Walkington | |
| 2010/0308844 A1 | 12/2010 | Day et al. | |
| 2010/0315267 A1* | 12/2010 | Chung et al. | 341/22 |
| 2010/0315349 A1 | 12/2010 | Choi | |
| 2011/0006980 A1 | 1/2011 | Taniguchi et al. | |
| 2011/0007023 A1 | 1/2011 | Abrahamsson et al. | |
| 2011/0021251 A1 | 1/2011 | Lindén | |
| 2011/0022393 A1 | 1/2011 | Wäller et al. | |
| 2011/0030502 A1 | 2/2011 | Lathrop | |
| 2011/0032203 A1 | 2/2011 | Pryor | |
| 2011/0037721 A1* | 2/2011 | Cranfill et al. | 345/174 |
| 2011/0043468 A1 | 2/2011 | Lathrop et al. | |
| 2011/0043491 A1 | 2/2011 | Oh | |
| 2011/0046788 A1* | 2/2011 | Daly et al. | 700/275 |
| 2011/0050588 A1 | 3/2011 | Li et al. | |
| 2011/0050589 A1 | 3/2011 | Yan et al. | |
| 2011/0050591 A1 | 3/2011 | Kim et al. | |
| 2011/0050629 A1 | 3/2011 | Homma et al. | |
| 2011/0054359 A1* | 3/2011 | Sazonov et al. | 600/595 |
| 2011/0057899 A1 | 3/2011 | Sleeman et al. | |
| 2011/0063248 A1 | 3/2011 | Yoon | |
| 2011/0069024 A1 | 3/2011 | Kim | |
| 2011/0074724 A1 | 3/2011 | Pryor | |
| 2011/0082627 A1 | 4/2011 | Small et al. | |
| 2011/0087983 A1 | 4/2011 | Shim | |
| 2011/0107272 A1 | 5/2011 | Aguilar | |
| 2011/0109578 A1 | 5/2011 | Wäller et al. | |
| 2011/0115736 A1 | 5/2011 | Joguet et al. | |
| 2011/0128164 A1 | 6/2011 | Kang et al. | |
| 2011/0128235 A1 | 6/2011 | Rogers et al. | |
| 2011/0128250 A1 | 6/2011 | Murphy et al. | |
| 2011/0141052 A1 | 6/2011 | Bernstein et al. | |
| 2011/0141053 A1 | 6/2011 | Bulea et al. | |
| 2011/0175754 A1 | 7/2011 | Karpinsky | |
| 2011/0175844 A1* | 7/2011 | Berggren | 345/174 |
| 2011/0175845 A1 | 7/2011 | Honda et al. | |
| 2011/0181430 A1 | 7/2011 | Hu et al. | |
| 2011/0181546 A1 | 7/2011 | Joguet et al. | |
| 2011/0187674 A1 | 8/2011 | Baker et al. | |
| 2011/0193813 A1 | 8/2011 | Gralewski et al. | |
| 2011/0205151 A1 | 8/2011 | Newton et al. | |
| 2011/0205162 A1 | 8/2011 | Wäller et al. | |
| 2011/0205182 A1 | 8/2011 | Miyazawa et al. | |
| 2011/0210926 A1* | 9/2011 | Pasquero et al. | 345/173 |
| 2011/0216015 A1* | 9/2011 | Edwards | 345/173 |
| 2011/0221564 A1 | 9/2011 | Deppiesse et al. | |
| 2011/0221684 A1 | 9/2011 | Rydenhag | |
| 2011/0221693 A1 | 9/2011 | Miyazaki | |
| 2011/0221694 A1 | 9/2011 | Karaoguz et al. | |
| 2011/0227870 A1 | 9/2011 | Kim | |
| 2011/0227872 A1 | 9/2011 | Huska et al. | |
| 2011/0239110 A1 | 9/2011 | Garrett et al. | |
| 2011/0242029 A1 | 10/2011 | Kasahara et al. | |
| 2011/0245992 A1* | 10/2011 | Stahlin et al. | 701/1 |
| 2011/0248942 A1 | 10/2011 | Yana et al. | |
| 2011/0253948 A1 | 10/2011 | Lussey et al. | |
| 2011/0260965 A1 | 10/2011 | Kim et al. | |
| 2011/0267294 A1 | 11/2011 | Kildal | |
| 2011/0273394 A1 | 11/2011 | Young et al. | |
| 2011/0275412 A1 | 11/2011 | Khawand | |
| 2011/0278078 A1 | 11/2011 | Schediwy et al. | |
| 2011/0290038 A1* | 12/2011 | Hoshino et al. | 73/862.627 |
| 2011/0304559 A1 | 12/2011 | Pasquero | |
| 2011/0304581 A1 | 12/2011 | An et al. | |
| 2011/0316811 A1 | 12/2011 | Kitagawa | |
| 2012/0001870 A1 | 1/2012 | Lee et al. | |
| 2012/0019448 A1 | 1/2012 | Pitkanen et al. | |
| 2012/0019463 A1 | 1/2012 | Ng et al. | |
| 2012/0026124 A1 | 2/2012 | Li et al. | |
| 2012/0032899 A1 | 2/2012 | Waeller et al. | |
| 2012/0032907 A1 | 2/2012 | Koizumi et al. | |
| 2012/0032915 A1 | 2/2012 | Wittorf | |
| 2012/0044169 A1 | 2/2012 | Enami | |
| 2012/0044172 A1 | 2/2012 | Ohki et al. | |
| 2012/0050159 A1 | 3/2012 | Yu et al. | |
| 2012/0050208 A1 | 3/2012 | Dietz | |
| 2012/0056818 A1 | 3/2012 | Shafi et al. | |
| 2012/0056837 A1 | 3/2012 | Park et al. | |
| 2012/0062603 A1 | 3/2012 | Mizunuma et al. | |
| 2012/0068946 A1 | 3/2012 | Tang et al. | |
| 2012/0068965 A1 | 3/2012 | Wada et al. | |
| 2012/0068969 A1 | 3/2012 | Bogana et al. | |
| 2012/0081327 A1 | 4/2012 | Heubel et al. | |
| 2012/0086659 A1 | 4/2012 | Perlin et al. | |
| 2012/0086670 A1 | 4/2012 | Teil et al. | |
| 2012/0092250 A1 | 4/2012 | Hadas et al. | |
| 2012/0092279 A1 | 4/2012 | Martin | |
| 2012/0092294 A1 | 4/2012 | Ganapathi et al. | |
| 2012/0092299 A1 | 4/2012 | Harada et al. | |
| 2012/0092324 A1 | 4/2012 | Buchan et al. | |
| 2012/0105358 A1 | 5/2012 | Momeyer et al. | |
| 2012/0105367 A1 | 5/2012 | Son et al. | |
| 2012/0113028 A1 | 5/2012 | Marsden et al. | |
| 2012/0113054 A1 | 5/2012 | Hashimoto et al. | |
| 2012/0113061 A1 | 5/2012 | Ikeda | |
| 2012/0120009 A1 | 5/2012 | Lussey et al. | |
| 2012/0127088 A1 | 5/2012 | Pance et al. | |
| 2012/0127107 A1 | 5/2012 | Miyashita et al. | |
| 2012/0127179 A1 | 5/2012 | Aspelin | |
| 2012/0139864 A1 | 6/2012 | Sleeman et al. | |
| 2012/0146945 A1 | 6/2012 | Miyazawa et al. | |
| 2012/0147052 A1 | 6/2012 | Homma et al. | |
| 2012/0154315 A1 | 6/2012 | Aono | |
| 2012/0154316 A1 | 6/2012 | Kono | |
| 2012/0154317 A1 | 6/2012 | Aono | |
| 2012/0154318 A1 | 6/2012 | Aono | |
| 2012/0154328 A1 | 6/2012 | Kono | |
| 2012/0154329 A1 | 6/2012 | Shinozaki | |
| 2012/0154330 A1 | 6/2012 | Shimizu | |
| 2012/0162122 A1 | 6/2012 | Geaghan | |
| 2012/0169609 A1 | 7/2012 | Britton | |
| 2012/0169617 A1 | 7/2012 | Mäenpää | |
| 2012/0169635 A1 | 7/2012 | Liu | |
| 2012/0169636 A1 | 7/2012 | Liu | |
| 2012/0179328 A1 | 7/2012 | Goldman-Shenhar | |
| 2012/0188181 A1 | 7/2012 | Ha et al. | |
| 2012/0194460 A1 | 8/2012 | Kuwabara et al. | |
| 2012/0194466 A1 | 8/2012 | Posamentier | |
| 2012/0204653 A1 | 8/2012 | August et al. | |
| 2012/0205165 A1 | 8/2012 | Strittmatter et al. | |
| 2012/0206393 A1 | 8/2012 | Hillis et al. | |
| 2012/0218212 A1 | 8/2012 | Yu et al. | |
| 2014/0054880 A1 | 2/2014 | Feinstein | |

FOREIGN PATENT DOCUMENTS

| | | |
|---|---|---|
| DE | 60130983 T2 | 7/2008 |
| EP | 1887595 A1 | 2/2008 |
| GB | 2423646 A | 8/2006 |
| GB | 2445505 A | 7/2008 |
| GB | 2448893 A | 11/2008 |
| GB | 2450587 A | 12/2008 |
| GB | 2452714 A | 3/2009 |
| GB | 2454619 A | 5/2009 |
| GB | 2462920 A | 3/2010 |
| GB | 2465077 A | 5/2010 |

(56) References Cited

FOREIGN PATENT DOCUMENTS

| | | | |
|---|---|---|---|
| GB | 2465713 | A | 6/2010 |
| GB | 2468870 | A | 9/2010 |
| GB | 2437997 | B | 7/2011 |
| GB | 2443658 | B | 9/2011 |
| JP | 61-146671 | | 7/1986 |
| JP | 06-037056 | | 5/1994 |
| JP | 2003-533847 | | 11/2003 |
| JP | 2005-175815 | | 6/2005 |
| JP | 2008-059459 | | 3/2008 |
| JP | 2008-181709 | | 8/2008 |
| JP | 2010-026610 | | 2/2010 |
| WO | 9803193 | A1 | 7/1998 |
| WO | 9938173 | A1 | 7/1999 |
| WO | 0079546 | A1 | 12/2000 |
| WO | 01/88935 | | 11/2001 |
| WO | 0188935 | A1 | 11/2001 |
| WO | 02099822 | A2 | 12/2002 |
| WO | 2005029514 | A1 | 3/2005 |
| WO | 2006016138 | A1 | 2/2006 |
| WO | 2008135787 | A1 | 11/2008 |
| WO | 2009034313 | A2 | 3/2009 |
| WO | 2010023449 | A1 | 3/2010 |
| WO | 2010109186 | A2 | 9/2010 |

OTHER PUBLICATIONS

Official U.S. Office Action, dated May 8, 2013, in U.S. Appl. No. 13/074,739.
Copending U.S. Appl. No. 13/074,830, filed Mar. 29, 2011.
Official U.S. Office Action, dated Dec. 5, 2012, in U.S. Appl. No. 13/074,830.
Official U.S. Office Action, dated Mar. 27, 2013, in U.S. Appl. No. 13/074,830.
Teulings, A.M.G.L., "Development of a numerical model for the US-DoT Side Impact Dummy," Technische Universiteit Eindhoven, Department of Mechanical Engineering, WFW-report DOT.2001.42, 2001, 63 pages.
Office Action, dated Nov. 4, 2014, received in connection with JP Application No. 2011-075258. (English Translation).
Notice of Allowance, dated Nov. 3, 2014, received in connection with related U.S. Appl. No. 13/078,793.
Office Action, dated Nov. 4, 2014, received in connection with JP Application No. 2011-082736. (English Translation).

* cited by examiner

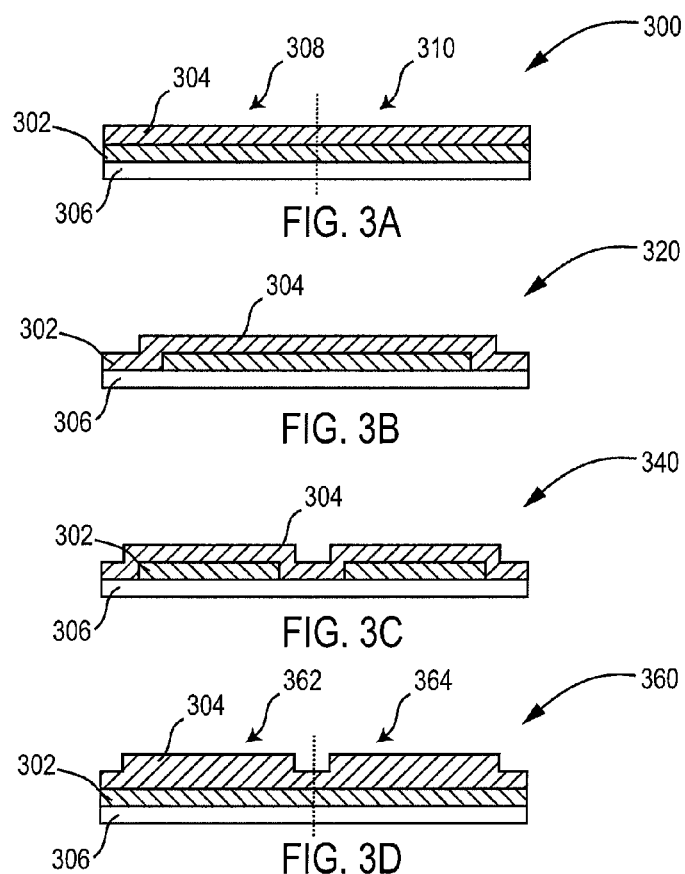
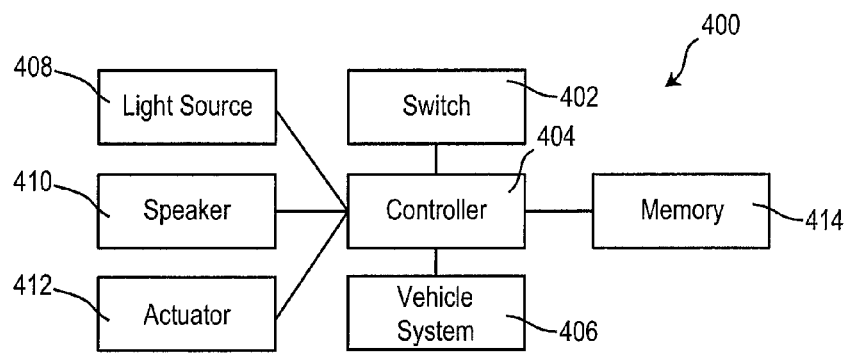
FIG. 4

STEERING WHEEL SENSORS

CROSS-REFERENCE TO RELATED PATENT APPLICATIONS

This application claims priority from Provisional Application U.S. Application 61/319,637, filed Mar. 31, 2010, incorporated herein by reference in its entirety.

BACKGROUND

The present disclosure relates generally to the field of steering wheels. More specifically, it relates to multifunction sensors on the steering wheel.

Current multifunction switches, for example steering wheel rim mounted switches, use electromechanical buttons. In most cases, each button performs a single action. Current switch configurations are generally very static, the button is visible and can be operated whether or not the function associated with the button is relevant to the current situation. Electromechanical switches generally operate based on the relative motion of two or more components, which require a gap between each of them. Such gaps can increase the risk of quality or performance issues (uneven gaps, object stuck in gaps).

Current steering wheel and driver airbag systems require physical movement of the airbag to react with a horn system. The movement requires at least 1.5-2.0 mm of travel to close a horn contact gap. This travel equates to a peripheral airbag to steering wheel gap of about 2.5 to 3.5 mm. The travel is achieved by mounting the airbag to springs and allowing the airbag to move. In addition the complex tolerancing stack between the steering wheel and airbag makes it difficult to achieving gap tolerances of less than +/−0.5 mm and symmetry tolerances between the left hand and right hand side of +/−0.3 mm. Current horn systems are also simple make/break type systems (on/off systems), with no variable output.

It would be desirable to provide a switching or sensor system for a steering wheel that has improved quality and performance. It would also be desirable to provide a horn system that is more accurately mounted and that provides variable output.

SUMMARY

One exemplary embodiment relates to a sensor for installation on a steering wheel includes a pressure sensitive material mounted on a base material of the steering wheel. The pressure sensitive material is configured to provide an electrical signal to a controller when pressure is applied. The controller provides a command to a vehicle system based on the electrical signal. The pressure sensitive material has at least one of a variable resistance and a variable capacitance based on the amount or type of pressure that is applied to the material. The electrical signal is based on the at least one of a variable resistance and a variable capacitance.

Another exemplary embodiment relates to a steering wheel. The steering wheel includes a base material and a sensor configured to provide an electrical signal to a controller when actuated. The controller provides a command to a vehicle system based on the electrical signal. The sensor includes a pressure sensitive material mounted on a base material of the steering wheel. The pressure sensitive material is configured to provide the electrical signal when pressure is applied. The pressure sensitive material has at least one of a variable resistance and a variable capacitance based on the amount or type of pressure that is applied to the material. The electrical signal is based on the at least one of a variable resistance and a variable capacitance.

Another exemplary embodiment relates to one or more sensors configured to provide an electrical signal to a controller when actuated. The controller provides a command to a vehicle system based on the electrical signal. The one or more sensors includes a pressure sensitive material mounted on a base material of the steering wheel. The pressure sensitive material is configured to provide an electrical signal to a controller when pressure is applied. The controller provides a command to a vehicle system based on the electrical signal. The pressure sensitive material having at least one of a variable resistance and a variable capacitance based on the amount or type of pressure that is applied to the material. The electrical signal based on the at least one of a variable resistance and a variable capacitance.

It is to be understood that both the foregoing general description and the following detailed description are exemplary and explanatory only, and are not restrictive of the invention as claimed.

BRIEF DESCRIPTION OF THE DRAWINGS

These and other features, aspects, and advantages of the present embodiments will become apparent from the following description, appended claims, and the accompanying exemplary embodiments shown in the drawings, which are briefly described below.

FIGS. 3A-3D are cross sections of pressure sensitive sensors or switches according to various exemplary embodiments.

FIG. 4 is a block diagram of a steering wheel sensing or switching system according to an exemplary embodiment.

DETAILED DESCRIPTION

According to various exemplary embodiments, a steering wheel design emphasizes an adaptive/dynamic approach to the configuration and operation of multifunction sensors. The use of alternative technologies for the sensors may decrease or eliminates gaps between components and provide new additional input possibilities to fine tune the functions of the sensors. According to various exemplary embodiments, the steering wheel replaces electromechanical switches with touch and pressure sensitive sensors or switches (e.g., seamless, adaptive switches) using touch and pressure sensitive material. Such pressure sensitive sensors allow for adaptive or dynamic functionality of the sensors based on the amount or location of pressure provided.

In some exemplary embodiments, by utilizing a pressure sensitive material capable of having a change in resistance with a change of pressure, a horn system may be configured to allow the driver airbag to be rigidly mounted with a tighter accuracy allowing for tighter tolerancing and limited physical travel from between about 5 microns to 0.5 mm. Use of the pressure sensitive material may also provide variable resistive output, allowing for a variable pressure sensitive horn system.

Figure 1:
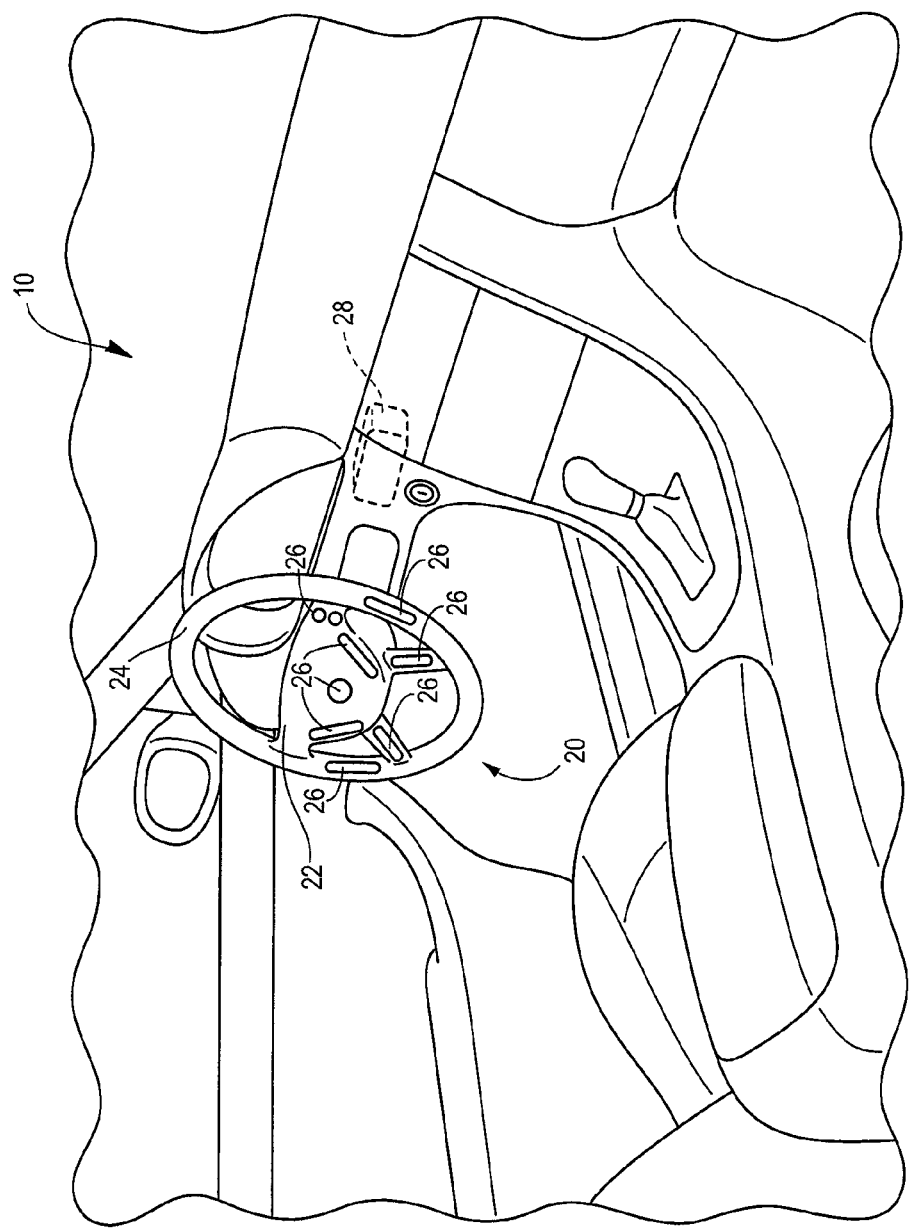
FIG. 1 is an isometric view of a vehicle showing a steering wheel with pressure sensitive sensors or switches according to an exemplary embodiment.
Figure 2A:
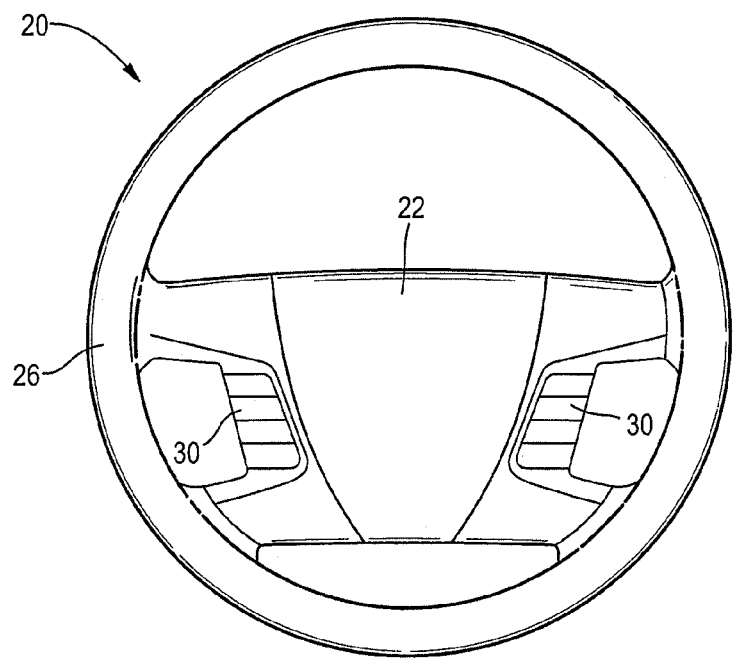
FIGS. 2A and 2B are front views of a steering wheel with pressure sensitive sensors or switches according to two exemplary embodiments.

Referring to FIG. 1, a vehicle driver may operate a vehicle from a cockpit (vehicle interior) 10 with a steering wheel 20. The driver may rotate the steering wheel 20 to turn the vehicle wheels and steer the vehicle in a desired direction. The steering wheel 20 includes a central hub 22 that is connected to an outer ring or rim 24. The hub 22 is coupled to the steering column of the vehicle 10. In one exemplary embodiment, the steering wheel 20 may be a four-spoke steering wheel, as shown in FIG. 2A. In another exemplary embodiment, the steering wheel 20 may be a three-spoke steering wheel, as shown FIG. 2B. In other exemplary embodiments, the steering wheel 20 may have a different number or arrangement of spokes.

The steering wheel 20 may also include various touch or pressure sensitive sensors 26 provided within easy reach of the driver. The sensors 26 may be located on the hub 22 (e.g., on the airbag cover, next to the airbag cover, on the side of the hub 22, etc.), on any surface of the rim 24, or on any surface of the spokes between the hub 22 and the rim 24. While a specific number of sensors are shown, according to other exemplary embodiments, there may be more or fewer sensors than illustrated and at varying locations. The sensors 26 may be used by the driver to control a vehicle audio system (e.g., volume, tuning, mode, etc.), vehicle lighting (e.g., overhead lighting, headlights, etc.), phone functions, or other functions such as cruise controls.

When a sensor 26 receives a user input, it provides an electrical signal to a controller 28. The pressure sensitive material outputs a variable resistance based on the amount or type (e.g., gesture, press, swipe, prolonged touch, short tap, etc.) of pressure that is applied to the material. In some exemplary embodiments, the pressure sensitive material may be a quantum tunneling composite, while in other exemplary embodiments, any other pressure sensitive material capable of having variable electrical characteristics may be used.

The controller 28 is configured to operate the audio system, lighting, phone, cruise control, or other function based on the electrical signal. The controller 28 may also provide user feedback when a sensor 26 is pressed, for example visual, audio, or vibratory feedback. Controls for systems such as an audio system, climate system, lighting system or other systems may also be provided elsewhere in the vehicle, such as on the vehicle dash or center console.

Figure 2B:
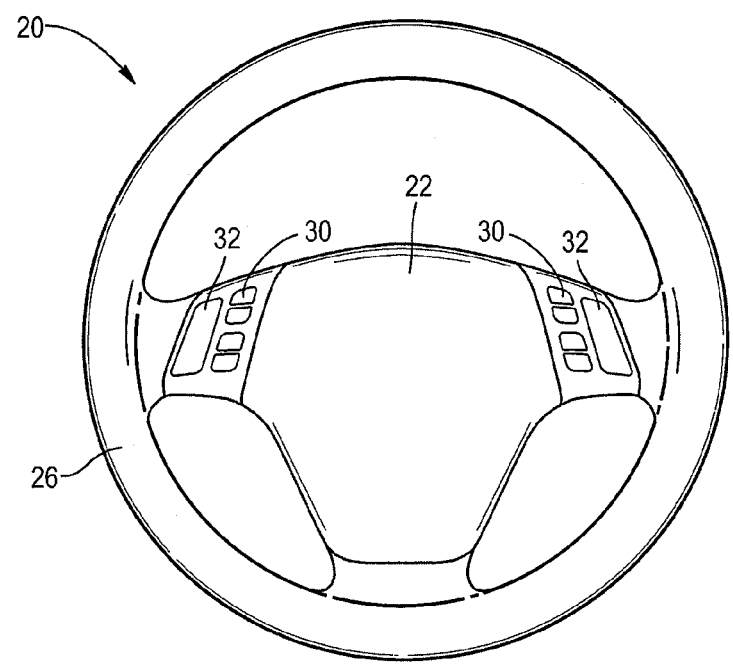

Referring now to FIGS. 2A-2B, the steering wheel 20 is further illustrated according to two exemplary embodiments. The pressure sensitive material may be sewn, bonded, screen printed, or otherwise attached to the material (e.g., leather, fabric, wood, etc) wrapping the rim 24, the hub 22, or the spokes of the steering wheel 20. The pressure sensitive material may be attached to a back of the steering wheel 20 material, within the steering wheel 20 material, or in any alternate configuration of the steering wheel 20. The structure beneath the wrapping material may be designed in such a way that the sensor 26 material may be recessed into the material to prevent or reduces unsightly bulges on the outer surface of the steering wheel 20. If required, the location of the sensor 26 can be made visible by various means including, but not limited to, changes in the pattern or color of the wrapping material, embroidery, illumination, etc.

In some exemplary embodiments, one or more sensors or switches 30 may be sectioned and identified (e.g., by recessed, raised, textured, colored areas, etc.). According to other exemplary embodiments, one or more sensors or switches 32 may comprise a touch or pressure sensitive zone that is configured to receive user input at any point within the zone. Such a zone may provide an electrical signal to the controller 28 based on the amount of pressure, the location of the pressure, the length pressure is provided, etc.

By using a touch sensitive material for the sensors 30,32 a single surface may be split into various zones that respond differently to the operator input depending on the area that is pressed. By combining several functions onto the same seamless surface, gaps between independent portions of switches may be reduced or eliminated. By using a touch sensitive material for the switch, the amount of deflection required for the switch to function may be greatly reduced (e.g., less than about 1 mm). Therefore the sensors 30,32 may be seamless as opposed to a regular electromechanical switch that requires gaps between each moving part.

While a specific number of sensors 26 are shown in specific positions on the steering wheel 20 of FIGS. 2A, and 2B, according to other exemplary embodiments, any number of sensors 30,32 may be in any position on or near the hub 22, the rim 24, or the spokes of the steering wheel 20. The pressure sensitivity of the sensors 30,32 may be calibrated differently depending on the function and location on the steering wheel 20 in order to prevent accidental activation of features by holding the rim in normal driving conditions.

The adaptive system design of the pressure sensitive sensing or switching system allows for a common area of the sensor to be used for different functions. The functions provided to the user at a given time may only be functions relevant to the current situation. Other non-relevant functions may not be available or may be hidden. By using a common sensing or switching area for multiple functions, the package size and footprint of the switch can be reduced.

Referring to FIGS. 3A-3D cross sections of switches 26 are illustrated according to various exemplary embodiments. Referring specifically to FIG. 3A, a switch 300 includes a pressure sensitive material 302 that is attached to a skin material 304 (e.g., leather, wood, plastic, vinyl, or other steering wheel hub or rim material) and/or a base material 306 of a steering wheel hub or rim, according to an exemplary embodiment. The switch 300 may optionally have multiple pressure zones 308 and 310 that are configured to for different functions or to receive different types of user input. As illustrated, the switch 300 may be generally flat and have no raised or recessed portions. A surface of the skin 304 may be colored, textured, or labeled to indicate the location and/or function of the pressure sensitive area to the driver. The skin 304 may also provide a protective coating to pressure sensitive material 302. While the switch 300 may be generally flat, in other exemplary embodiments, the switch 300 may be contoured in one direction or may be at least partially contoured in two directions. The switch 300 may also include one or more raised or recessed areas, for example at least between sensing zones.

According to some exemplary embodiments, the skin 304 may be replaced by a display panel (LCD, LED, OLED, etc.) or a touch panel. In such exemplary embodiments, pressure on the panel may be detected by the pressure sensitive material 302 to detect location of the pressure (e.g., the zones 308, 310), magnitude of the pressure, duration of the pressure, etc. The display panel provide indications of the functionality of the switch 300. The functionality of the switch may dynamically change based on vehicle conditions or user selections. In such instances, the display panel may change the indication to describe the current functionality of the switch 300. It is noted that while two zones 308,310 have been illustrated, according to other exemplary embodiments, the switch 300 may include any number of zones, which may be of any appropriate size.

Referring specifically to FIG. 3B, a switch 320 includes a pressure sensitive material 302 that is attached to a skin material 304 and/or a base material 306 of a steering wheel hub or rim, according to an exemplary embodiment. As illustrated, the pressure sensitive material 302 may only exist between a portion of the base material 306 and the skin material 304. The skin material 304 may overlay or attach to the pressure sensitive material 302 to produce a raised area of the switch 320 to indicate the location of the pressure sensitive area. A surface of the skin 304 may also be colored, textured, or labeled to further indicate the location and/or function of the pressure sensitive area to the driver.

Referring specifically to FIG. 3C, a switch 340 includes two areas of pressure sensitive material 302 that are attached to a skin material 304 and/or a base material 306 of a steering wheel hub or rim, according to an exemplary embodiment. As illustrated, the pressure sensitive material 302 may discretely exist between multiple portions of the base material 306 and the skin material 304. The skin material 304 may overlay or attach to the pressure sensitive material 302 to produce a raised area of the switch 340 to indicate the location of the pressure sensitive areas. A surface of the skin 304 may also be colored, textured, or labeled to further indicate the location and/or function of the pressure sensitive areas to the driver. While two portions of pressure sensitive material 302 are illustrated, according to other exemplary embodiments, any number pressure sensitive portions may be used.

Referring specifically to FIG. 3D, a switch 360 includes a pressure sensitive material 302 that is attached to a skin material 304 and/or a base material 306 of a steering wheel hub or rim, according to an exemplary embodiment. As illustrated, the pressure sensitive material 302 is generally flat and may include multiple pressure zones 362 and 364 that are configured to for different functions or to receive different types of user input. The skin 304 may be formed to have one or more raised and recessed sections. The skin material 304 may overlay or attach to the pressure sensitive material 302 to produce raised an/or recessed areas of the switch 360 to indicate the location of the pressure sensitive area(s). A surface of the skin 304 may also be colored, textured, or labeled to further indicate the location and/or function of the pressure sensitive area to the driver.

Referring to FIG. 4, a switching system 400 is configured to receive user inputs and provide feedback to a user of actuation of a pressure sensitive switch 402, according to an exemplary embodiment. When the pressure sensitive material of the switch 402 is actuated, an electrical signal is sent to a controller 404. The controller 404 is configured to provide electrical commands to a vehicle system 406 based on the received electrical signal. For example, the controller 404 may provide electrical commands to operate an audio system, lighting, phone, cruise control, or other vehicle system 406 based on the signal.

The controller 404 may operate a light source 408 to provide visual feedback, a speaker 410 (e.g., of the vehicle audio system or a speaker in the steering wheel) to provide audio feedback, or an actuator 412 (e.g., located beneath the skin of the hub or rim of the steering wheel) to provide vibratory feedback to the driver when the switch 402 is actuated. The feedback may also change in intensity depending on the amount of force provided to the switch 402. The controller 404 may be any hardware and/or software platform capable of receiving an electrical signal and controlling vehicle functions of the vehicle system 406.

In some exemplary embodiments, the light source 408 may be configured to provide a visual indication of the function of the sensor. In such embodiments, the light source 408 may illuminate based on the context of the vehicle and whether the function of the sensor is available. For example, the light source 408 may illuminate an indicator or text for a volume control sensor or switch for an audio system. If the audio system is on, the light source 408 may illuminate to indicate that the volume control is available. If the audio system is off, the light source may be off to indicate that the volume control is not available. Such contextual illumination may be applied to any vehicle function being controlled by a pressure sensitive material. In some embodiments, the light source 408 may overlay or be adjacent to the pressure sensitive material. In other embodiments, the light source 408 may be located behind, below or within a translucent or transparent pressure sensitive material.

Figure 5:
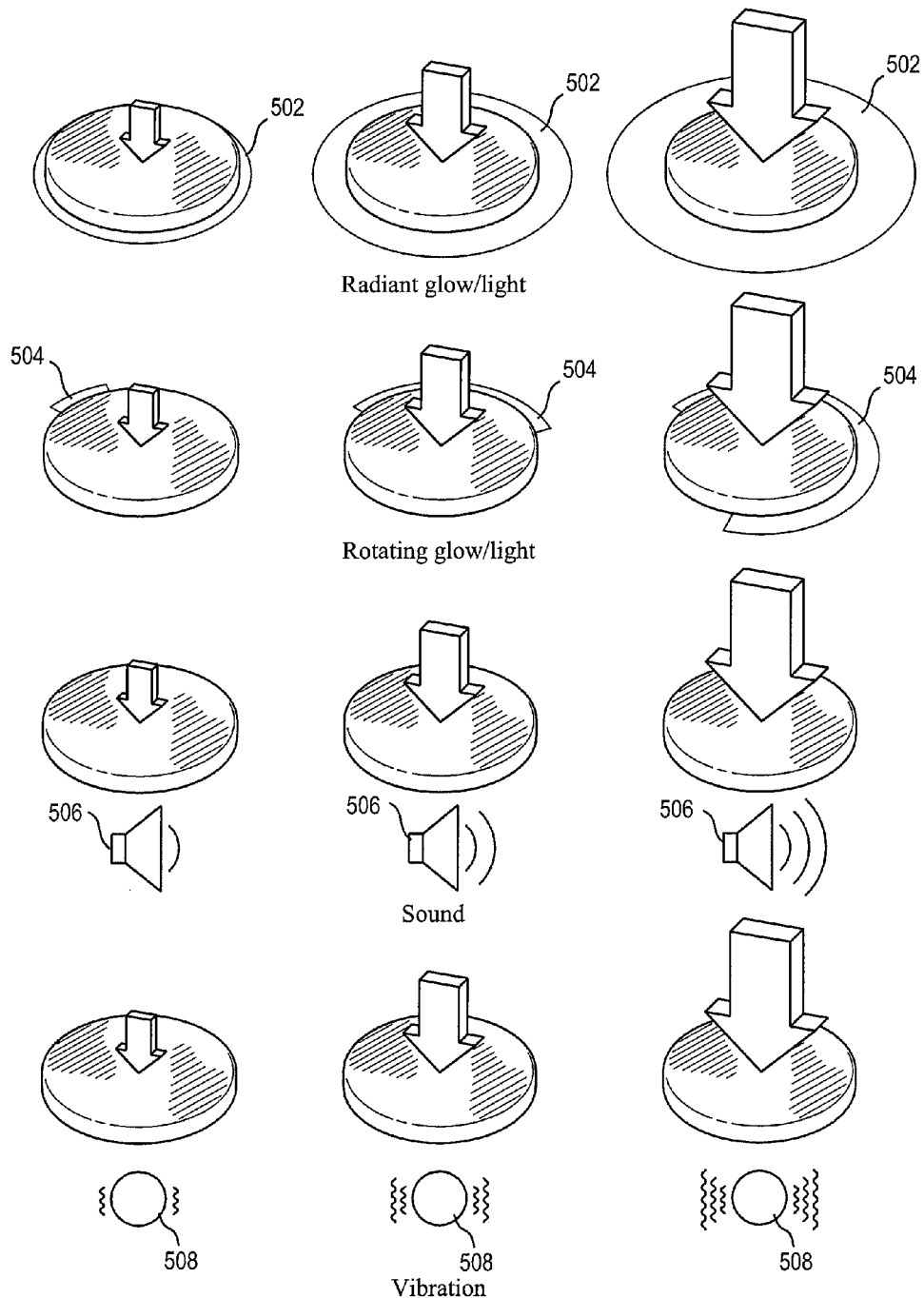
FIG. 5 includes illustrations of user feedback for pressure sensitive sensors or switches according to an exemplary embodiment.

Referring also to FIG. 5, various types of driver feedback are illustrated according to some exemplary embodiments. Pressure sensitivity may be used to add a multitude of interface layers in addition to a standard On/Off switch to refine the interface with the user.

In one exemplary embodiment, when the switch 402 is pressed, a band of light 502 may be provided around the perimeter of the switch 402 (e.g., a radiant glow) by the light source 408. The width and/or brightness of the light band 502 may change depending on the amount of pressure the driver provides to the switch 402. For example, the band 502 may be thicker or may be brighter if the switch 402 is pressed harder.

In another exemplary embodiment, when the switch 402 is pressed, a rotating band of light 504 may be provided around a portion of the perimeter of the switch 402 (e.g., a rotating glow) by the light source 408. The length and/or speed of the light band 504 may change depending on the amount of pressure the driver provides to the switch 402. For example, the band 504 may be longer or may rotate faster if the switch 402 is pressed harder.

In another exemplary embodiment, when the switch 402 is pressed, the speaker 410 may provide a sound or audible alert 506 to the driver. The volume of the sound 506 may change depending on the amount of pressure the driver provides to the switch 402. For example, the volume of the sound 506 may be louder if the switch 402 is pressed harder.

In another exemplary embodiment, when the switch 402 is pressed, the actuator 412 may provide a vibration 508 to the driver. The strength of the vibration 508 may change depending on the amount of pressure the driver provides to the switch 402. For example, the amount of vibration 508 may be greater if the switch 402 is pressed harder.

The pressure sensitive material of the switch 402 may have variable electrical characteristics depending on the amount of force applied to it. These variable electrical characteristics may be used to further control the function of the switch 402. Taking the example of a switch controlling the volume of the audio system, the harder the switch is pushed, the faster the volume may increase. If the switch is only gently pressed, the volume may increase slowly. Similarly, a horn system can be activated by a pressure sensitive switch 402 to produce a variable sound level depending on the force applied to the switch 402, as described in greater detail below.

Referring back to FIG. 4, in some exemplary embodiments, the function of switch 402 may change based on a status of the vehicle. In such embodiments, the switch 402 may include a display portion configured to provide dynamic indications of the function and/or status of the switch. The controller 404 may also communicate with a volatile or non-volatile memory device 414 configured to store vehicle and/or switch 402 status identifiers.

Figure 6:
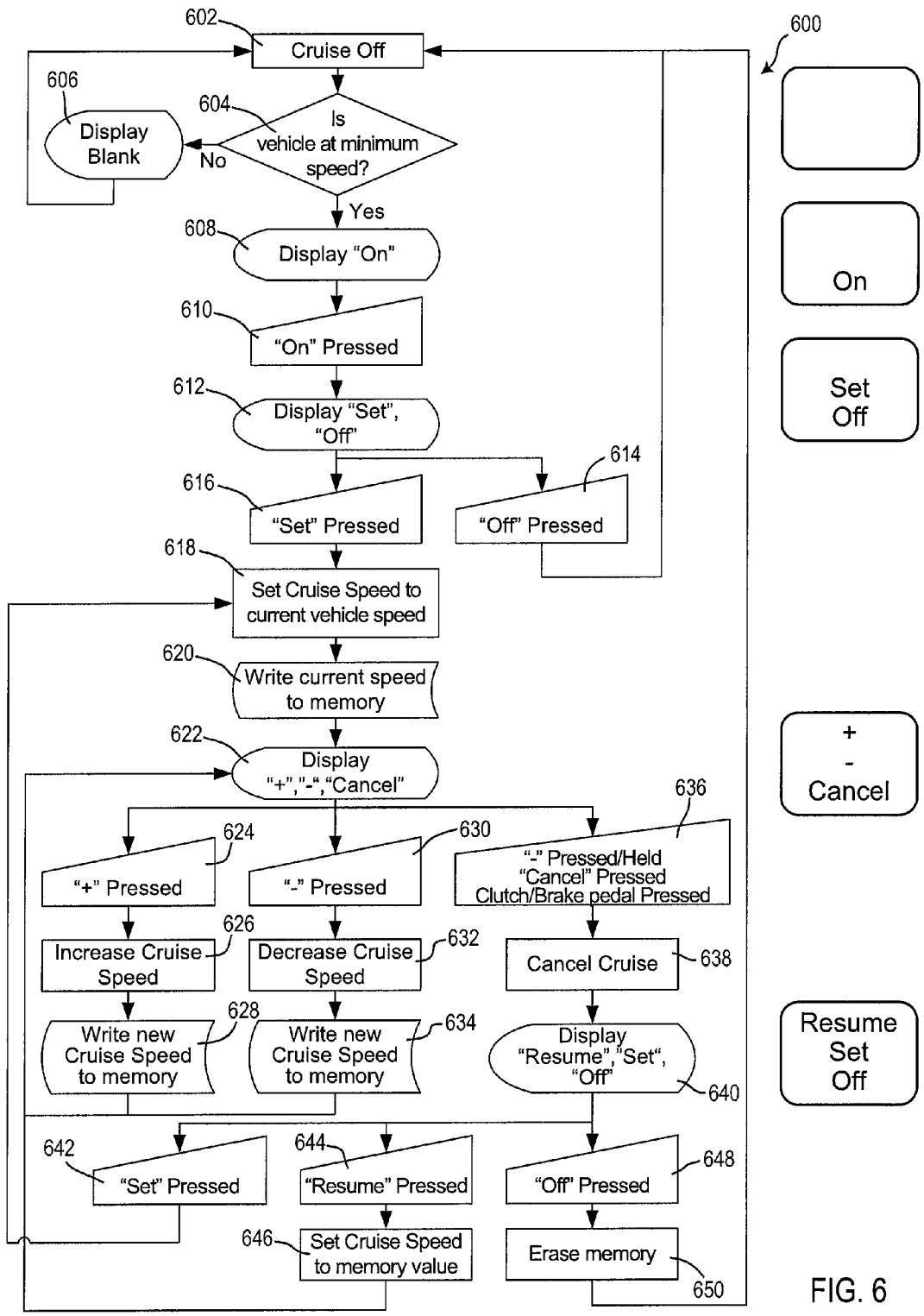
FIG. 6 is a flowchart of a cruise control method using pressure sensitive sensors or switches according to an exemplary embodiment.

Referring also to FIG. 6, a flow chart 600 illustrates an adaptive interface for a cruise control switch, according to an exemplary embodiment. Initially, cruise control is set to be off (step 602). Controller 404 determines whether the vehicle reaches the minimum required speed to be able to use cruise control (step 604). Until the minimum speed is reached, the switch has no function and the display remains blank (step 606). When the minimum speed is reached, the "On" function is made available and is displayed (step 608). When the cruise control is turned on (step 610), the options to turn cruise control off ("Off" function) or to activate or set the cruise control speed ("Set" function) are illustrated (step 612). If the cruise control is turned off (step 614), the display returns to either the blank or the "On" only state depending on vehicle speed. If the cruise control is set (step 616), the controller 404 sets the cruise control speed to the current speed of the vehicle (step 618). The controller 404 then writes or stores the current speed to the memory 414 (step 620).

The display then shows the options to increase ("+" function) the speed, decrease ("−" function) the speed, or cancel the cruise control mode (step 622). If "+" is pressed (step 624), the controller 404 increases the cruise control speed (step 626), writes the new cruise control speed to the memory 414 (step 628), and waits for further user input at step 622. If "−" is pressed (step 630), the controller 404 decreases the cruise control speed (step 632), writes the new cruise control speed to the memory 414 (step 634), and waits for further user input at step 622.

If "−" is held, "cancel" is pressed, or the brake or clutch pedal is pressed (step 636), the controller 404 cancels the cruise control (step 638) and displays the options "Resume," "Set," and "Off" (step 640). If "set" is pressed (step 642), the controller 404 returns to step 618 to set the cruise speed. If "resume" is pressed (step 644), the controller 404 sets the cruise speed to the value stored in the memory 414 (step 646) and waits for further user input at step 622. If "off" is pressed (step 648), the controller erases the memory 414 and turns the cruise control off (step 650), returning to step 602 to check for vehicle speed.

Figure 7:
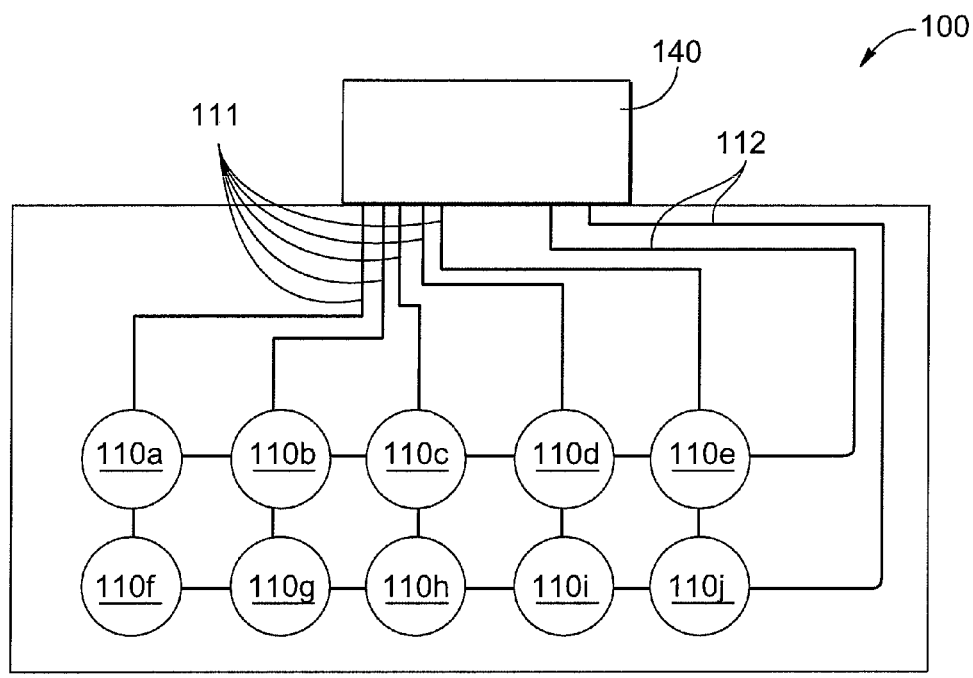
FIG. 7 is a top view of a sensor sheet according to an exemplary embodiment.
Figure 8:
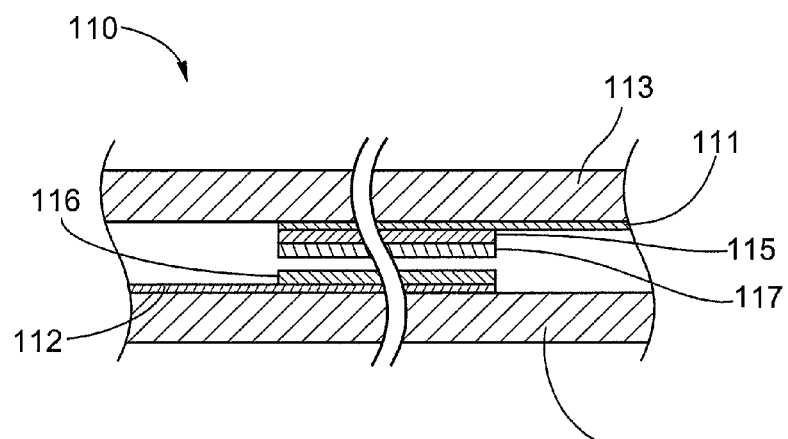
FIG. 8 is sectional view of a sensor according to an exemplary embodiment.

With reference to FIGS. 7-8, a sensor sheet 100 generally includes one or more sensors 110 (e.g., a switch 30, 300, 320, 340, 360; a pressure sensitive zone 26, 32, etc.). The sensors 110 are electrically coupled by input and output conductors 111, 112 to a controller or measuring device (e.g., controller 28, controller 404, etc.), which is configured to send and receive electrical signals to and from the sensors 110.

As shown in FIG. 8, the sensors 110 generally include sheets of carrier material 113, 114, conductors 111, 112, electrodes 115, 116, and a pressure sensitive material 117 configured in a generally symmetric, layered relationship (e.g., a carrier sheet, conductor, and electrode disposed on each side of the pressure sensitive material). As discussed in further detail below, the carrier sheets 113, 114, conductors 111, 112, electrodes 115, 116, and pressure sensitive material 117 may be selectively configured to change conductive or electrical characteristics of the sensors 110 according to the forces expected during a dynamic impact event.

The first and second carrier sheets 113, 114 may, for example, be configured to be the skin 304 and the base material 306 relative to a surface of the steering wheel 20. Each of the carrier sheets 113, 114 may be made from a semi-rigid, sheet material. For example, each of the carrier sheets 113, 114 may be a polyethylene terephthalate (PET) sheet, having a thickness of approximately 50 microns. According to other exemplary embodiments, the carrier sheets 113, 114 may be made from other materials (e.g., polycarbonate, polyamide, other extruded plastic materials, leather, other plastic, fabric, wood, multiple materials within one sheet, different materials for each sheet, etc.) or have other thicknesses (e.g., between approximately 25 microns and 250 microns, varying thickness for one sheet, different thicknesses for different sheets, etc.).

Each of the conductors 111, 112 is configured to conduct electrical signals between the one of the sensors 110 and the controller or measuring device. The conductors are made from a conductive material, such as silver (Ag). The conductors 111, 112 may be coupled, deposited, or applied to the carrier sheets 113, 114 through a printing process, such as two- or three-dimensional ink jet or screen printing, vapor deposition, or conventional printed circuit techniques, such etching, photo-engraving, or milling. The input conductor 111 may, for example, be coupled to an interior surface of the first carrier sheet 113, and the output conductor 112 may, for example, be coupled to an interior surface of the second carrier sheet 114. The conductors 111, 112 have a finished thickness of less than approximately 25 microns. According to other exemplary embodiments, the conductors 111, 112 may be made from other materials (e.g., copper (Cu) or other conductive materials, a combination thereof, etc.), may be made from different materials than each other, may have a different finished thickness (e.g., more or less than approximately 25 microns, varying thickness for each conductor, different thickness or different conductors, etc.), or be provided by other methods.

Each of the electrodes 115, 116 is configured to efficiently conduct electrical signals to or from the pressure sensitive material 117. The electrodes 115, 116 are made from a conductive material, such as carbon (C). The electrodes 115, 116 may be coupled, deposited, or applied to the conductors 111, 112, and/or carrier sheets 113, 114, respectively, by a printing process, such as two- or three-dimensional ink jet or screen printing, vapor deposition, or conventional printed circuit techniques, such etching, photo-engraving, or milling. The electrodes 115, 116 may have a finished thickness of less than approximately 25 microns. According to other exemplary embodiments, the electrodes 115, 116 may be made from other materials, may be made from different materials than each other, may have a different finished thickness (e.g., approximately 25 microns or more, varying thickness for each electrodes, different thickness than other electrodes, etc.), be provided by different methods, or be provided in a different order (e.g., one of the electrodes may be applied to the pressure sensitive material 117).

Figure 9:
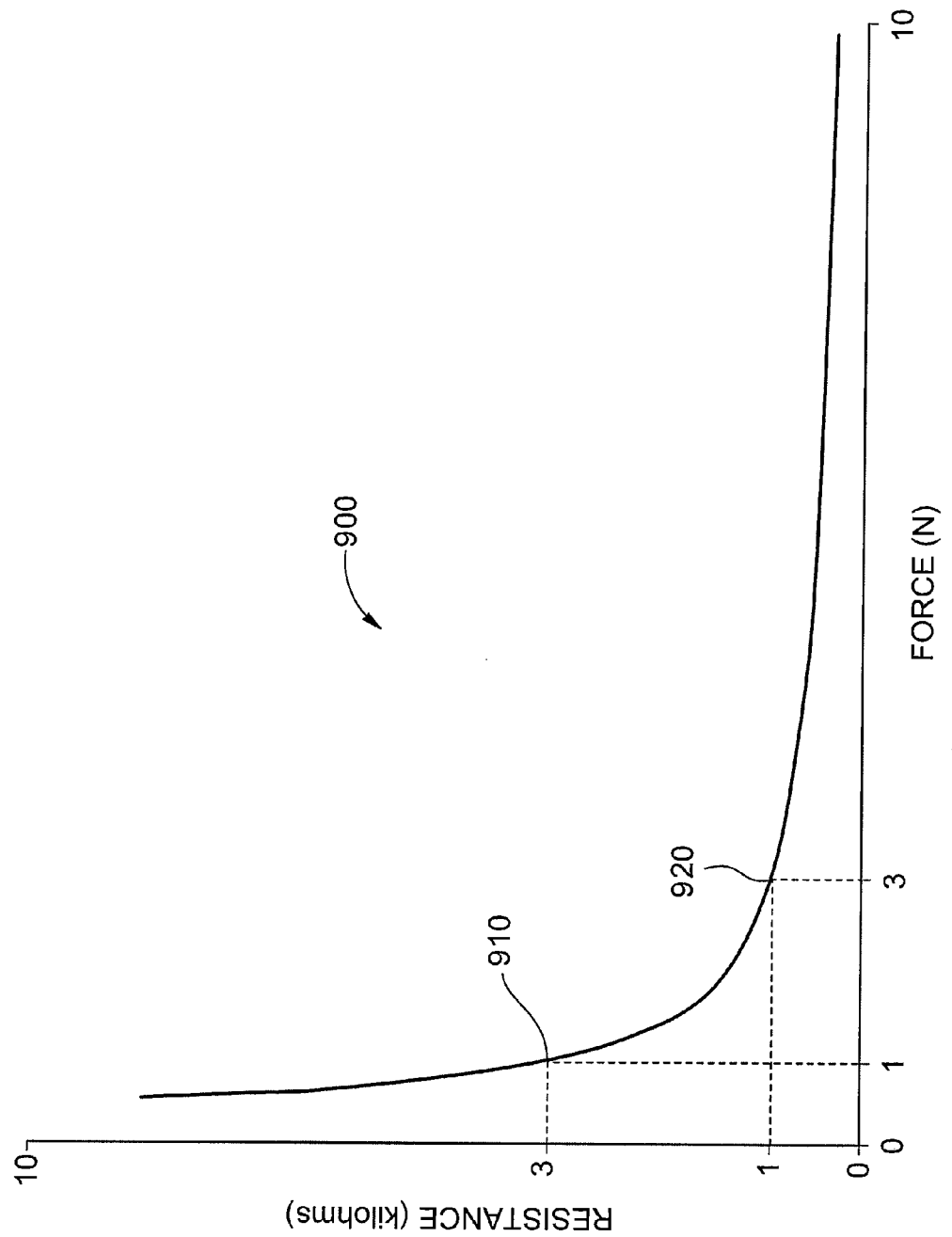
FIG. 9 is a graph of theoretical resistance characteristics of a sensor according to an exemplary embodiment.

The pressure sensitive material 117 is configured to change resistance or conductive/electrical characteristics in response to force or pressure acting thereupon. More particularly, the pressure sensitive material 117 behaves substantially as an isolator when no force or pressure is present and decreases in resistance as more force or pressure is present. Between low and high forces, the pressure sensitive material 117 responds to force or pressure in a predictable manner, decreasing in resistance with increasing force. These characteristics are shown in the graph 900 of FIG. 9, which depicts the Resistance v. Force characteristics of a sensor 110 as described herein. FIG. 9 is discussed in further detail below.

The pressure sensitive material 117 may, for example, be a carbon nanotube conductive polymer. The pressure sensitive material 117 is applied to one of the electrodes 115, 116 by a printing process, such as two- or three-dimensional ink jet or screen printing, vapor deposition, or conventional printed circuit techniques, such etching, photo-engraving, or milling.

As pressure sensitive materials 117 with smaller particle sizes are used, such as that of grapheme or a grapheme conductive polymer, the pressure sensitive material 117 may also be applied through conventional printed circuit techniques, such as vapor deposition. According to other exemplary embodiments, the pressure sensitive material may be a silicene polymer material doped with a conductor, such as silver or copper.

According to other exemplary embodiments, the pressure sensitive material is a quantum tunneling composite (QTC), which is a variable resistance pressure sensitive material that employs Fowler-Nordheim tunneling. QTC is a material commercially made by Peratech (www.peratech.com), of Brompton-on-Swale, UK. The QTC material in the sensors 110 may act as an insulator when zero pressure or zero force is applied, since the conductive particles may be too far apart to conduct, but as pressure (or force) is applied, the conductive particles move closer to other conductive particles, so that electrons can pass through the insulator layer changing the insulator layer changing the resistance of the sensor 110. Thus, the resistance of the QTC in the sensors 110 is a function of the force or pressure acting upon the sensor 110.

The carrier sheets 113, 114 are coupled together to form the sensor sheet 100 after the conductors 111, 112, electrodes 115, 116, and pressure sensitive material 117 are deposited thereon. The carrier sheets 113 may, for example, be laminated together, such that the conductors 111, 112, electrodes 115, 116, and pressure sensitive material 117 are in proper alignment. The lamination process may for example be a conventional process using heat and pressure. Adhesives may also be used. The total thickness of the sensor sheet 100 and/or sensors 110 may be approximately 120 microns. According to other exemplary embodiments, the carrier sheets 113, 114 may, for example, be coupled together in other manners (e.g., laminating without heat or pressure). Further, the sensor sheet 100 and/or sensors 110 may have a different total thickness (e.g., greater than or equal to approximately 70 microns).

Now referring to FIG. 9, a graph 900 of the Resistance v. Force characteristics of a sensor 110 is shown. The resistance of the sensor 110 is shown on the Y-axis, and the force acting upon the sensor 110 is shown on the X-axis. At relatively low forces (e.g., at point 910 below approximately 1 N), the sensor 110 exhibits relatively high resistance characteristics (e.g., approximately 300 kilohms or higher) behaving substantially as an isolator. At relatively high forces (e.g., at point 920 above approximately 3 N), the sensor 110 exhibits relatively low resistance characteristics (e.g., approximately 1 kilohm or lower) approaching behaving substantially as a conductor. Between approximately 1 N and 3 N, the sensor 110 exhibits intermediate levels of resistance between approximately 3 kilohms and 1 kilohm that decreases in a predictable manner with increasing force.

The conductive or electrical characteristics of the sensor 110 (i.e., the Resistance v. Force characteristic curve 900) may configured according to the selection of different materials and providing different arrangements of the carrier sheets 113, 114, conductors 111, 112, electrodes 115, 116, and pressure sensitive material 117. For example, as described above, the conductive layers of the sensor 110 (i.e., the conductors 111, 112, electrode 115, 116, and pressure sensitive material 117) may be configured in different manners, such as with different materials and/or different thickness, to change the conductive or electrical characteristics of the sensor 110. The type of material may also be used to tune the characteristics of the sensor 110. For example, a particular QTC material be selected (e.g., a polymer, a conductor blend, etc.) to affect the conductive or electrical characteristics.

The carrier sheets 113, 114, may also be configured in different manners to change the conductive or electrical characteristics of the sensor 110. For example, the relative position of the carrier sheets 113, 114, may be adjusted. Referring to FIG. 8, the carrier sheets 113, 114 may be spaced apart in regions proximate the sensor 110 so as to provide a gap (as shown) between the pressure sensitive material 117 and the electrode 115. By providing a gap, a sufficient force must act upon the carrier sheets 113, 114 to deflect a corresponding distance before force acts upon the pressure sensitive material. Thus, referring to the graph of FIG. 9, the Resistance v. Force characteristics of the sensor 110 may be shifted rightward by a desired force offset (i.e., number of Newtons) by providing a gap of a certain size (e.g., 35 microns) corresponding to the spring rate of the carrier sheets 113, 114. The gap may, for example, be provided by an adhesive used to combine the carrier sheets 113, 114. According to another exemplary embodiment, the sensor 110 may be preloaded to have the opposite effect of a gap, such as with an externally provided physical load, effectively shifting the Resistance v. Force characteristics of the sensor 110 leftward.

The conductive or electrical characteristics of the sensor 110 may also be changed according to the materials used for the carrier sheets 113, 114. A stiffer first or outer carrier sheet 113 may be provided, such as by utilizing a thicker material or a different material. By using a stiffer outer sheet 113, greater force must act upon the outer carrier sheet 113 to deflect a similar distance as compared to a less stiff material. Thus, referring to the graph of FIG. 9, the Resistance v. Force characteristics of the sensor 110 are elongated or extended (not shifted) rightward, such that for higher loads result, incremental changes of force result in larger changes of resistance to allow for more accurate detection by the controller or measuring device. The inner sheet 114 may also be configured to provide a stable base and may have a lower, same, or higher stiffness than the outer sheet 113.

While the sensors 110 have been described as being responsive to compressive loads, the sensors 110 are also responsive to bending loads that cause deflection of the carrier sheets 113, 114 and pressure sensitive material 117. Thus, for simple and/or reliable calibration, the pressure sensors 110 are maintained in a generally flat arrangement where measurements for compressive loads are desired. According to other exemplary embodiments, the sensors 110 may be utilized in applications where measurements for torsional loads are desired.

In various exemplary embodiments, a horn system can be activated by a pressure sensitive switch to produce a variable sound level depending on the force applied to the switch. By utilizing a pressure sensitive material capable of providing a change in resistance with a change of pressure, a horn system may be configured to allow the driver airbag to be rigidly mounted with a tighter accuracy allowing for tighter tolerancing and limited physical travel from between about 5 microns to 0.5 mm. Use of the pressure sensitive material may also provide variable resistive output, allowing for a variable pressure sensitive horn system. For example, the volume and/or tone of the horn may be adjusted based on the amount of pressure on the pressure sensitive material. Use of the pressure sensitive material may also provide for improved aesthetics of the steering wheel or horn systems.

In one exemplary embodiment, the pressure sensitive material may be integrated into a conventional horn system. Conventional horn systems typically include moving structures with two metal opposing horn contacts separated by springs. The springs define the horn operation force. The distance between the horn contacts determines the displacement of the airbag required to allow the contacts to touch and thus activate the horn. The two metal horn contacts may be replaced with a pressure sensitive material that may be significantly thinner than a contact gap.

In another exemplary embodiment, the pressure sensitive material may be integrated in place of a conventional horn system. In such a system, the only movement of the driver airbag may come from the airbag service removal springs, which are used for aiding airbag assembly to the wheel and for airbag servicing. The airbag may attach directly to the steering wheel using a snap system. Two or more springs may be mounted between the steering wheel and airbag with a vertical force that must be overcome to snap the airbag to the wheel. The snap system may needs a small amount of over travel in order to snap the airbag to the steering wheel correctly. This over travel may be used as the springing mechanism for the horn. The pressure sensitive material may be sandwiched between the steering wheel and airbag and uses the over travel as the spring force.

In another exemplary embodiment, the pressure sensitive material may be integrated into the driver airbag cover to monitor the flex of the cover for the horn operation. Integration into the airbag cover may be similar to membrane horns, but the pressure sensitive material may monitor deflection over a certain threshold to activate a variable output.

In another exemplary embodiment, the pressure sensitive material may be integrated between the driver airbag cover and retainer attachment points to monitor for movement between the cover and the retainer. Many driver airbag covers are now assembled by snapping the cover to plastic retainer housings. A limited amount of over travel may be required to correctly assemble the horn system. The pressure sensitive material may be applied at the over travel. Spring force may be generated by the cushion pack within the airbag module.

In another exemplary embodiment, the pressure sensitive material may be integrated into the steering wheel rim to act as a shock horn system. Pressure over a specific or threshold force at the rim may activate the horn system (with or without variable output). The pressure sensitive material may be applied through the full 360 degrees of the steering wheel rim. Alternatively, the pressure sensitive material may be applied at less than the full 360 degrees of the rim. The shock horn system may take into account the forces used for regular steering maneuvers or driving operations and monitor for higher forces directly applied to the rim for activation of the horn.

In another exemplary embodiment, the pressure sensitive material may be integrated into the steering wheel rim to detect the hand position of the driver. If the controller detects that the driver only has one hand on the wheel, it may provide a visual, audio, and/or vibratory feedback to the driver to prompt the driver to use both hands. If the controller detects that the driver has no hands on the wheel, it may provide visual, audio, and/or vibratory feedback to attempt to get the attention of the driver. Alternatively or additionally, the controller may cause the vehicle engine to decelerate, the brakes to actuate, a hazard signal to illuminate, and/or a communication system to contact emergency personnel. The pressure sensitive material may be applied through the full 360 degrees of the steering wheel rim. Alternatively, the pressure sensitive material may be applied at less than the full 360 degrees of the rim, for example at positions a driver is likely to hold the steering wheel.

In another exemplary embodiment, the pressure sensitive material may be integrated into or onto a driver airbag surrounding decal or shroud to allow the airbag module to be fixed in place. The bezel, shroud, or decal may then monitor for force or pressure. The outer bezel may be assembled to the airbag system and may shield the steering wheel and airbag peripheral gap.

In another exemplary embodiment, the pressure sensitive material may be integrated into the steering wheel near the airbag periphery. The airbag cover may overlap the steering wheel surface (e.g., polyurethane, leather, etc.) such that when the airbag cover is pressed for the horn, the cover flexes into the underlying steering wheel mounted pressure sensitive material, thus activating the horn.

It is noted that according to the various exemplary embodiments above, the pressure sensitive material generally provides a change in resistance allowing a vehicle controller to receive input from the driver, whether the driver has gloves (or other hand covering) on his or her hands or not. In other exemplary embodiments, the pressure sensitive material may instead be configured to provide variable capacitance based on the amount of pressure applied. In such embodiments, the gain of the capacitive sensors may be adjusted such that the driver may input commands even if he or she is wearing gloves.

According to other exemplary embodiments, the same approach can be used for several kinds of switches controlling various functions, including, but not limited to: audio system, HVAC system, wipers, trip computer, phone, and navigation system. Various technologies can be used to create the adaptive system, including but not limited to: selective illumination through painted and etched surfaces, selective illumination through layered screen printed material, and programmable icons/text/graphics on electronics displays (e.g., LCD, LED, OLED, etc.).

In addition to the above mentioned new aspects of pressure sensitive switches, by omitting or reducing mechanical components such as springs, sliding/rocking buttons, etc., the switch may be more robust than current designs. The switch may also have lower cost due to reduced part count and may have an improved user interface and look.

While the system is described above as using a pressure sensitive material, in other exemplary embodiments, different sensing means may be used. For example, the switches may include capacitance, inductance, or resistance-based sensors.

As utilized herein, the terms "approximately," "about," "substantially", and similar terms are intended to have a broad meaning in harmony with the common and accepted usage by those of ordinary skill in the art to which the subject matter of this disclosure pertains. It should be understood by those of skill in the art who review this disclosure that these terms are intended to allow a description of certain features described and claimed without restricting the scope of these features to the precise numerical ranges provided. Accordingly, these terms should be interpreted as indicating that insubstantial or inconsequential modifications or alterations of the subject matter described and claimed are considered to be within the scope of the invention as recited in the appended claims.

It should be noted that the term "exemplary" as used herein to describe various embodiments is intended to indicate that such embodiments are possible examples, representations, and/or illustrations of possible embodiments (and such term is not intended to connote that such embodiments are necessarily extraordinary or superlative examples).

The terms "coupled," "connected," and the like as used herein mean the joining of two members directly or indirectly to one another. Such joining may be stationary (e.g., permanent) or moveable (e.g., removable or releasable). Such joining may be achieved with the two members or the two members and any additional intermediate members being integrally formed as a single unitary body with one another or with the two members or the two members and any additional intermediate members being attached to one another.

References herein to the positions of elements (e.g., "top," "bottom," "above," "below," etc.) are merely used to describe the orientation of various elements in the FIGURES. It should be noted that the orientation of various elements may differ according to other exemplary embodiments, and that such variations are intended to be encompassed by the present disclosure.

It is important to note that the construction and arrangement of the switch systems as shown in the various exemplary embodiments is illustrative only. Although only a few embodiments have been described in detail in this disclosure, those skilled in the art who review this disclosure will readily appreciate that many modifications are possible (e.g., variations in sizes, dimensions, structures, shapes and proportions of the various elements, values of parameters, mounting arrangements, use of materials, colors, orientations, etc.) without materially departing from the novel teachings and advantages of the subject matter described herein. For example, elements shown as integrally formed may be constructed of multiple parts or elements, the position of elements may be reversed or otherwise varied, and the nature or number of discrete elements or positions may be altered or varied. The order or sequence of any process or method steps may be varied or re-sequenced according to alternative embodiments. Other substitutions, modifications, changes and omissions may also be made in the design, operating conditions and arrangement of the various exemplary embodiments without departing from the scope of the present embodiments.

What is claimed is:

1. A sensor for installation on a steering wheel, comprising: a pressure sensitive material mounted on a base material of the steering wheel, the pressure sensitive material configured to provide an electrical signal to a controller when pressure is applied, the controller providing a command to a vehicle system based on the electrical signal, the pressure sensitive material having at least one of a variable resistance and a variable capacitance based on the amount or type of pressure that is applied to the pressure sensitive material, the electrical signal based on the at least one of the variable resistance and the variable capacitance, wherein a magnitude of the electrical signal provided by the pressure sensitive material is proportional to the amount of pressure applied to the pressure sensitive material, and wherein the controller provides an electrical signal to an actuator, the actuator providing a vibration when the pressure sensitive material is pressed, at least one of the strength, modulation, and frequency of the vibration changing based on the amount of pressure provided to the pressure sensitive material.

2. The sensor of claim 1, wherein the pressure sensitive material comprises at least one of a quantum tunneling composite, a carbon nanotube conductive polymer, grapheme conductive polymer, and a conductive doped silicene polymer.

3. The sensor of claim 1, wherein the pressure sensitive material comprises multiple pressure zones configured for different functions or to receive different types of user input.

4. The sensor of claim 1, wherein the sensor comprises a switch that is generally flat and has no raised or recessed portions.

5. The sensor of claim 1, further comprising at least one of a skin material, a display panel, and a touch panel overlaying or attached to the pressure sensitive material.

6. The sensor of claim 5, wherein a surface of the skin material comprises at least one of a raised area, coloring, texturing and labeling to indicate a location and/or a function of the pressure sensitive material.

7. The sensor of claim 1, further comprising a light source mounted near the pressure sensitive material, the light source configured to vary in at least one of intensity, shape, color, and modulation based on the amount of pressure provided to the pressure sensitive material.

8. The sensor of claim 1, wherein the controller provides an electrical signal to a speaker for providing a sound or audible alert when the pressure sensitive material is pressed, at least one of the volume, tone, frequency and modulation of the sound changing based on the amount of pressure provided to pressure sensitive material.

9. The sensor of claim 1, wherein the controller is configured to provide commands to the vehicle system based on a magnitude of the electrical system such that a magnitude of actuation of the vehicle system is based on the amount of pressure applied to the pressure sensitive material.

10. The sensor of claim 1, wherein the sensor is located on a hub, spoke, or rim of the steering wheel.

11. The sensor of claim 1, further comprising a pair of electrodes configured to receive the electrical signal and provide the electrical signal to the controller.

12. The sensor of claim 1, further comprising a light source configured to provide a visual indication of the function of the sensor, the light source illuminating based on the context of the vehicle and whether the function of the sensor is available.

13. A sensing system for installation in a vehicle, comprising:
one or more sensors configured to provide an electrical signal to a controller when actuated, the controller providing a command to a vehicle system based on the electrical signal, the one or more sensors comprising:
a pressure sensitive material mounted on a base material of a portion of the vehicle, the pressure sensitive material configured to provide an electrical signal to a controller when pressure is applied, the controller providing a command to a vehicle system based on the electrical signal, the pressure sensitive material having at least one of a variable resistance and a variable capacitance based on the amount or type of pressure that is applied to the pressure sensitive material, the electrical signal based on the at least one of the variable resistance and the variable capacitance, wherein a magnitude of the electrical signal provided by the pressure sensitive material is proportional to the amount of pressure applied to the pressure sensitive material, and wherein the controller provides an electrical signal to an actuator, the actuator providing a vibration when the pressure sensitive material is pressed, at least one of the strength, modulation, and frequency of the vibration changing based on the amount of pressure provided to the pressure sensitive material.

14. The sensing system of claim 13, wherein the sensor comprises multiple pressure zones configured for different functions or to receive different types of user input.

15. The sensing system of claim 13, wherein the sensor comprises a switch that is generally flat and has no raised or recessed portions.

16. The sensing system of claim 13, further comprising at least one of a skin material, a display panel, and a touch panel overlaying or attached to the pressure sensitive material.

17. The sensing system of claim 13, further comprising at least one of a light source mounted around the perimeter of the pressure sensitive material, a speaker and an actuator, the at least one of a light source, speaker, and actuator being configured to operate based on the amount of pressure provided to the pressure sensitive material.

18. The sensor of claim 1, wherein the controller is configured to provide commands to the vehicle system based on a magnitude of the electrical system such that a magnitude of actuation of the vehicle system is based on the amount of pressure applied to the pressure sensitive material.

19. The sensing system of claim 13, wherein the sensor is located on a hub, spoke, or rim of the steering wheel.

20. The sensing system of claim 13, wherein the sensor further comprises a pair of electrodes configured to receive the electrical signal and provide the electrical signal to the controller.

21. A steering wheel, comprising:
  a base material; and
  a sensor configured to provide an electrical signal to a controller when actuated, the controller providing a command to a vehicle system based on the electrical signal, the sensor comprising:
    a pressure sensitive material mounted on a base material of the steering wheel, the pressure sensitive material configured to provide the electrical signal when pressure is applied, the pressure sensitive material having at least one of a variable resistance and a variable capacitance based on the amount or type of pressure that is applied to the pressure sensitive material, the electrical signal based on the at least one of the variable resistance and the variable capacitance, wherein a magnitude of the electrical signal provided by the pressure sensitive material is proportional to the amount of pressure applied to the pressure sensitive material, and wherein the controller provides an electrical signal to an actuator, the actuator providing a vibration when the pressure sensitive material is pressed, at least one of the strength, modulation, and frequency of the vibration changing based on the amount of pressure provided to the pressure sensitive material.

* * * * *